United States Patent
Moukara et al.

(10) Patent No.: US 7,183,022 B2
(45) Date of Patent: Feb. 27, 2007

(54) METHOD FOR PRODUCING A MASK SET FOR LITHOGRAPHY INCLUDING AT LEAST ONE MASK AND METHODS FOR IMAGING STRUCTURES OF A PREDETERMINED LAYOUT INTO A COMMON EXPOSURE PLANE

(75) Inventors: Molela Moukara, München (DE); Reinhard Pufall, München (DE)

(73) Assignee: Infineon Technolgies AG, Munich (DE)

( * ) Notice: Subject to any disclaimer, the term of this patent is extended or adjusted under 35 U.S.C. 154(b) by 281 days.

(21) Appl. No.: 10/439,193

(22) Filed: May 15, 2003

(65) Prior Publication Data
US 2003/0232255 A1 Dec. 18, 2003

(30) Foreign Application Priority Data
May 15, 2002 (DE) ................. 102 21 648

(51) Int. Cl.
*G03F 1/00* (2006.01)
*G03C 5/00* (2006.01)

(52) U.S. Cl. ................. 430/5; 430/311; 430/394
(58) Field of Classification Search ............ 430/5, 430/311, 394
See application file for complete search history.

(56) References Cited

U.S. PATENT DOCUMENTS

| 5,242,770 A | | 9/1993 | Chen et al. | |
| 5,306,584 A | * | 4/1994 | Palmer | 430/5 |
| 5,407,763 A | * | 4/1995 | Pai | 430/5 |
| 5,821,014 A | | 10/1998 | Chen et al. | |
| 6,543,045 B2 | * | 4/2003 | Ludwig et al. | 716/21 |
| 2002/0110753 A1 | | 8/2002 | Pforr et al. | |
| 2003/0022074 A1 | * | 1/2003 | Nolscher | 430/5 |
| 2003/0091911 A1 | * | 5/2003 | Noelscher | 430/5 |

FOREIGN PATENT DOCUMENTS

| DE | 199 37 742 A1 | 3/2001 |
| EP | 0770926 A2 | 5/1997 |

OTHER PUBLICATIONS

Minoru Sugawara et al.: "Evaluation of Phase-Shifting Masks for Dense Contact Holes Using the Exposure-Defocus and Mask Fabrication Latitude Methodology", Jpn. J. Appl. Phys., vol. 33, Part 1, No. 12B, Dec. 1994, pp. 6801-6808.

* cited by examiner

*Primary Examiner*—Geraldina Visconti
(74) *Attorney, Agent, or Firm*—Laurence A. Greenberg; Werner H. Stemer; Ralph E. Locher

(57) ABSTRACT

A method for producing a mask set for lithography including at least one mask, has a predetermined layout of structures which are provided for imaging into a common exposure plane and which are transferred to the masks as a basis. Strongly coupled structures that are so closely adjacent one another, at least in sections, that they are strongly coupled in the case of simultaneous imaging are distributed between at least two different masks of the mask set.

24 Claims, 5 Drawing Sheets

METHOD FOR PRODUCING A MASK SET FOR LITHOGRAPHY INCLUDING AT LEAST ONE MASK AND METHODS FOR IMAGING STRUCTURES OF A PREDETERMINED LAYOUT INTO A COMMON EXPOSURE PLANE

BACKGROUND OF THE INVENTION

Field of the Invention

The invention lies in the field of semiconductor technology and relates to a method for producing a mask set for lithography that includes at least one mask.

Lithographic methods are often used for forming structures in a substrate. In this case, generally a radiation-sensitive layer, e.g. a photoresist, is applied to the substrate and exposed using a mask in which the structures to be imaged are present as a two-dimensional pattern. The mask may contain e.g. regions that are opaque and transparent to the radiation used during imaging. The radiation that passes through the transparent regions leads to a latent image in the radiation-sensitive layer. The latent image can be made visible by development. During development, the exposed regions are removed. As a result, the pattern contained on the mask has been transferred to the radiation-sensitive layer, which, for its part, subsequently serves as an etching mask for the etching of the substrate. The etching mask may finally be removed. As a result, the substrate has the structure contained in the mask.

Lithography is one of the most important process steps in the fabrication of integrated circuits. The conventional method uses optical systems, in which diffraction effects occur. As a result, circuit elements, i.e. structures (e.g. interconnects or active gate regions of conventional transistors) of the layout to be imaged, having dimensions in the region of or less than the wavelengths used for imaging the masks, may be imaged in an unsharp manner. The imaged pattern thus no longer corresponds to that contained on the mask. Undesirable consequences of this unsharp imaging may be e.g. circuit interruptions, classic short circuits, or undesired quantum mechanical tunneling currents between imaged structures.

In order to combat the problems in this area, a series of so-called resolution enhancement techniques have been developed which make it possible to improve the resolution of the imaging systems used. These techniques include the use of alternating phase masks and of diffusing elements.

In the case of alternating phase masks, transparent regions on both sides of narrow structures to be imaged have a phase difference of 180°, i.e. the radiation passing through them is phase-shifted by 180° with respect to one another. In the exposure plane, this phase shift leads to destructive interference, as a result of which the edges of the structures to be imaged are imaged more sharply.

In contrast thereto, diffusing elements serve as additional diffraction structures (see e.g. European Patent Application NO. EP 0 770 926 A2 and U.S. Pat. No. 5,242,770). The diffusing elements are so narrow that they cannot themselves be imaged by the radiation used for imaging the masks. However, radiation is diffracted at these diffusing elements and can likewise interfere with the radiation passing through the structure to be imaged. This principle is also known by the term "optical proximity correction".

Both measures lead to satisfactory solutions if the structures to be imaged are at a relatively large distance from one another. By contrast, if these structures are closely adjacent, the radiation respectively passing through them can interact with one another and lead to undesirable results. What is problematic, moreover, is that the diffusing elements (auxiliary structures) have to be at a certain distance from the structures in order to yield optimum results. Therefore, the distance between structures cannot be reduced arbitrarily.

One possibility for combating this problem is dealt with in U.S. Pat. No. 5,821,014, where the diffusing elements are omitted between very closely adjacent structures and the fact that diffraction effects that can be utilized positively occur on account of the close disposition of the structures is exploited. Accordingly, the structures themselves form the diffusing elements for their directly adjacent structures. In the case of a somewhat larger distance, the mutual influencing of the radiation passing through the structures is less and only one diffusing element in each case is disposed between adjacent structures. The diffusing element is assigned to both structures.

The specialist article by M. Sugawara et al., "Evaluation of Phase-Shifting Masks for Dense Contact Holes Using the Exposure-Defocus and Mask Fabrication Latitude Methodology" Jpn. J. Appl. Phys, Vol. 33 (1994) pp 6801–6808, deals with the configuration of diffusing elements provided with phase shifters in the case of closely adjacent contact holes. In this case, in the same way as in U.S. Pat. No. 5,821,014, the configuration of diffusing elements is dispensed with between very closely adjacent structures.

It has been found, however, that, in the case of very closely adjacent structures without diffusing elements, the imaging is in some instances significantly worse than in the case of structures with diffusing elements. Since the distance between structures is becoming increasingly smaller in the context of advancing miniaturization, a significant deterioration in the imaging of these structures must be expected.

The alternating phase assignment of the adjacent contact holes in the case of Sugawara et al. has likewise been found to be problematic. Contact holes with a different phase are imaged with a different intensity.

SUMMARY OF THE INVENTION

It is accordingly an object of the invention to provide a method for producing a mask set for lithography including at least one mask and methods for imaging structures of a predetermined layout into a common exposure plane that overcome the hereinafore-mentioned disadvantages of the heretofore-known devices of this general type and that improves the imaging of closely adjacent structures.

With the foregoing and other objects in view, there is provided, in accordance with the invention, a method for producing a mask set for lithography that includes at least one mask. In the method, a predetermined layout is used as a basis for imaging structures into a common exposure plane. The structures are ultimately transferred to the mask. The structures are transferred in a manner dependent on the coupling of the structures such that no strongly coupled structures are present on the at least one mask.

In this case, strong coupling between adjacent structures is understood to mean that the radiation passing through the adjacent structures, in the event of simultaneous imaging of these structures, interferes with one another to a considerable extent, so that the adjacent structures in some instances can no longer be imaged correctly. Therefore, according to the invention, strongly coupled structures are separated and preferably distributed between different masks. By contrast, if there is no strong interaction between the structures of the predetermined layout, the structures are transferred to a common mask.

Strong coupling is present in particular when the distance between the structures is so small that an auxiliary structure (diffusing element) leading to an improvement of the imageability (resolution) can no longer be positioned between the structures. Accordingly, if auxiliary structures can be disposed between adjacent structures, division between two masks is not necessary. By contrast, if the distance is so small that auxiliary structures for improving the imageability can no longer be disposed between adjacent structures, division of the structures is carried out.

Preferably, the mask set to be produced includes at least two masks that are provided for imaging into a common exposure plane. Strongly coupled structures which are so closely adjacent one another, at least in sections, that they are strongly coupled in the case of simultaneous imaging are distributed between the at least two different masks of the mask set.

One aim is to decouple strongly coupled structures in the predetermined layout by division between at least two masks in order thus to improve the imageability thereof.

The predetermined layout is taken as a basis for the assessment of whether structures are strongly coupled. The structures contained therein are then subdivided, using rules, into structures that are strongly coupled and structures that are not strongly coupled. If there are no strongly coupled structures in the layout, a division is not necessary. However, if the predetermined layout has strongly coupled structures, the latter are distributed between different masks. Therefore, the method according to the invention is employed particularly in the case of those layouts that have strongly coupled structures.

From a physical standpoint, the radiation diffracted at the edges of the individual structures interacts with one another if the edges are spaced apart at a relatively small distance from one another. Therefore, in the sense of the invention, distance between the structures is understood to be the distance between opposite edges of adjacent structures.

The structures may have a different geometrical configuration and in some instances represent very complicated constructions. It can therefore happen that adjacent structures are at different distances from one another in sections or in regions, i.e. the distance between the opposite edges of the structures varies. In order to obtain a desired decoupling, the structures that are strongly coupled only in sections are preferably separated as well.

If individual structures have individual sections or regions that are strongly coupled to other sections or regions of the same structure, it is also possible to provide a partitioning of an originally contiguous structure into two or more separate structures. Therefore, it lies within the scope of the invention for the division of the structures also to encompass a partitioning of individual structures. In this case, a contiguous structure in the predetermined layout is partitioned into two or more substructures and the individual substructures are distributed between different masks.

Although at least two masks are produced according to the invention, they all serve for imaging the structures that are predetermined in the layout into a common exposure plane, for example into one and the same radiation-sensitive layer. This layer is accordingly exposed by using at least two masks. In which case, it is only after exposure with all the masks of the mask set that the structure that is predetermined by the layout is transferred to the radiation-sensitive layer. In this case, according to the invention, the layout is subdivided and distributed between at least two masks.

One aim of the invention is to trace back groups of strongly coupled structures to subgroups that are not coupled or are only weakly coupled. The number of subgroups and thus the number of masks to be produced is determined by the highest-order coupling. In this case, the order to coupling is defined by the number of structures involved in the coupling. By way of example, two masks are required for one-dimensionally strongly coupled or strongly interacting structures. One-dimensionally coupled devices (e.g. the structures having a one-dimensional configuration) are disposed along a line.

Accordingly, with the method according to the invention, strongly coupled structures are converted into weakly coupled structures or structures that are not coupled by division between individual masks.

The determination of the degree of coupling, i.e. whether structures are strongly coupled, weakly coupled or not coupled to one another, is preferably based on the geometrical distance between and the width of auxiliary structures that are assigned to the individual structures in order to improve their imageability.

Therefore, preferably:
individual structures are assigned auxiliary structures, that cannot be imaged with the radiation provided for the imaging of the masks and have a specific distance d from the structure respectively assigned to them and a specific width b and serve to improve the imageability of the structures,
distances D between adjacent structures are determined,
a classification of the distances D is performed in a manner dependent on the coupling strength of adjacent structures,
strong coupling being present if $D<2d+b$, and
weak or no coupling being present if $D \geq 2d+b$,
the structures being divided between the masks such that only weakly coupled structures or structures that are not coupled to one another are disposed on the individual masks.

The starting point is the predetermined layout. Firstly, in this layout all the structures for which an improvement in the imaging by using auxiliary structures is desired are assigned auxiliary structures. One aim in this case is firstly to determine the position and the size of the auxiliary structures. Whether and how these auxiliary structures are configured will be defined at a later point in time. In particular, the way in which the structures respectively assigned to them are distributed between the masks plays a part in this case.

The auxiliary structures generated have a certain width b and a certain distance d from the structures assigned to them, b and d being chosen such that a sufficient, ideally optimal improvement in the imaging occurs. In the case of very closely adjacent, i.e. strongly coupled structures, it may happen that auxiliary structures and structures cover one another or auxiliary structures assigned to a structure are at too short a distance from adjacent other structures. Therefore, the distances D between the structures are classified in a manner dependent on d and b. Strong coupling is assumed when $D<2d+b$. In contrast to this, weak or no coupling is present if $D \geq 2d+b$. The structures are divided between the at least two masks of the mask set in such a way, then, that no mask has disposed on it structures which have a distance $D<2d+b$ from structures situated on the mask. Accordingly, only weakly coupled structures or structures that are not coupled are situated on each mask. The adverse mutual influencing of strongly coupled structures is therefore eliminated. Accordingly, only masks without strongly coupled structures are present.

A further advantage may be seen in the fact that, by virtue of the decoupling of strongly coupled structures, the latter now can be assigned auxiliary structures and the imaging thereof is thus considerably improved. In contrast to the methods of the abovementioned U.S. Pat. No. 5,821,014 and the specialist article by M. Sugawara et al., according to the invention, the interaction of very closely adjacent structures is avoided by dividing the structures between at least two masks. The structures distributed between the at least two masks in this way are then at a sufficiently large distance from one another in order that auxiliary structures can actually be disposed on the individual masks. Moreover, the auxiliary structures can then be disposed at a distance from the structures that is advantageous for improving the imageability. In the case of the previously known methods, by contrast, it is necessary to dispense with the use of auxiliary structures that are optimally adapted for improving the imageability for the very closely adjacent structures, as a result of which the imaging of these structures suffers.

The strongly coupled structures divided in this way or the structures for which division is not necessary can furthermore be classified with regard to weak and no coupling, weak coupling being present if $2d+b \leq D < 2(d+b)$, and no coupling being present if $D>2(d+b)$, and
on the individual masks, in the case of adjacent weakly coupled structures, only an auxiliary structure is disposed between the structures.

In principle, all the structures present in the predetermined layout are divided between the at least two masks. According to the invention, however, it is only necessary for strongly coupled structures to be separated, i.e. be divided between different masks weakly coupled structures or structures that are not coupled can intrinsically be transferred to one mask. However, they, too, can be divided between different masks.

The structures that are held to be weakly coupled after the division of the structures share an auxiliary structure lying between them. The distance between weakly coupled structures does not suffice to assign dedicated auxiliary structures to every structure. It shall be reemphasized that strongly coupled structures distributed between different masks now represent weakly coupled structures or structures that are not coupled on the individual masks, i.e. the distance between these and adjacent structures on the respective mask is so large that at most weak coupling is present.

In the case of adjacent non-coupled structures, by contrast, each structure is preferably assigned dedicated auxiliary structures, in other words, on the individual masks, these structures each have dedicated auxiliary structures that do not interact with other structures.

Preferably, in the case of the strongly coupled structures, additional auxiliary structures are generated and are disposed on individual masks such that, after the strongly coupled structures have been divided between individual masks of the mask set, a symmetrical configuration of auxiliary structures is present with regard to the strongly coupled structures on the masks.

One aim is to produce a symmetrical continuation of the auxiliary structures at edges of strongly interacting regions. In the sense of the invention, interacting regions are understood to be contiguous regions of strongly coupled structures in the predetermined layout. An asymmetrical distribution of the auxiliary structures is present at the edges of such regions after the division of the structures and the auxiliary structures assigned thereto. This can be represented e.g. in the simplest case on two strongly coupled structures. The latter are distributed between e.g. two different masks. Each of these structures is assigned dedicated auxiliary structures. Since the structures lie laterally next to one another in the layout, the auxiliary structures respectively assigned to them are likewise offset laterally with respect to one another. This means, however, that the auxiliary structures of one structure are distributed asymmetrically with respect to the other structure, and vice versa. Even if the auxiliary structures are situated on different masks, they diffract the radiation striking them not only in the direction of the structure that is simultaneously imaged with them, but also in the direction of the respective other structure to be imaged by the other mask. The respective other structure is thereby influenced in the exposure plane. In order to produce a symmetrical influencing here, additional auxiliary structures are produced in each case on the masks. The auxiliary structures correspond to a symmetrical continuation of the auxiliary structures disposed on the mask along the connecting axis between the strongly coupled structures.

Furthermore, it is advantageous if the structures and the auxiliary structures on the masks are formed by phase-shifting regions that are transparent to the radiation provided for imaging the masks. The transparent regions of the structures have a phase shifted through 180° with regard to the auxiliary structures respectively assigned to them. Alternating phase masks are thus produced, which contribute to further improvement of the imageability of the structures. What is essential in this case is that a phase shift through 180° is produced between the radiation passing through the structures and the radiation passing through the auxiliary structures respectively assigned to the structures.

In the case of phase-shifting regions, the method according to the invention also makes it possible to avoid or eliminate phase conflicts. The term phase conflicts is used if nontransparent regions are bounded by in-phase regions even though a boundary by in-antiphase regions is necessary, or if in-antiphase regions come too close together at undesirable locations. The desired interference effects fail to occur in the first case, while disturbing interference effects occur in the second case. Such phase conflicts occur e.g. in the event of great spatial proximity of the individual structures or arise at geometrically complicated structures, e.g. T structures. The separation of strongly coupled structures means that fewer structures than prescribed by the layout are produced on each of the masks produced. The density of the structures is therefore reduced. Consequently, a multiplicity of phase conflicts is also obviated. In the case of closely adjacent contact holes to be imaged, phase conflicts between contact holes and auxiliary structures can be avoided, in particular, by applying the method according to the invention.

Preferably, the structures are patterns of closely adjacent contact holes that occur e.g. with high regularity. Contact holes have to be disposed close together relatively often. The method according to the invention leads to particularly good results in the case of contact holes that are disposed closely in the layout in such a way. In particular, the imaging of closely adjacent contact holes is actually made possible for the first time with a satisfactory result. In the case of the simultaneous imaging of closely adjacent, i.e. strongly coupled contact holes from the previously known methods, sufficient imaging into the exposure plane is possible only to a limited extent.

Furthermore, the invention relates to a method for imaging structures of a predetermined layout into a common exposure plane using a mask set including at least one mask, on which are disposed only structures that are weakly coupled or not coupled to one another and auxiliary structures assigned to the structures, which auxiliary structures cannot be imaged with the radiation used for the imaging of the at least one mask. The at least one mask is a phase mask and all structures having the same phase and all auxiliary structures having the opposite phase with respect thereto.

The structures are all decoupled, i.e. a strong interaction is not present. The distance between adjacent structures is so large that phase conflicts do not play a part. Therefore, all the structures can be provided with the same phase. Only the auxiliary structures have to have the opposite phase with respect thereto. In concrete terms, then, all the structures may have the phase 0° and all the auxiliary structures may have the phase 180°. The major advantage is that the phase assignment can be effected simply and globally. Accordingly, complicated phase assignment algorithms can be completely dispensed.

The invention furthermore relates to a method for imaging structures of a predetermined layout into a common exposure plane using a mask set including at least two masks. Only structures that are weakly coupled or not coupled to one another are disposed on the individual masks.

According to the invention, at least two masks are used for imaging a layout of predetermined structures into a common exposure plane. In this case, the masks only contain weakly coupled structures or structures that are not coupled, thereby avoiding the problems mentioned further above. The at least two masks are preferably imaged successively into the common exposure plane. The latter may be a layer sensitive to the radiation used.

Preferably, auxiliary structures are disposed on the masks, which cannot be imaged with the radiation used for the imaging of the masks and serve to improve the imageability of the structures assigned to them. The auxiliary structures having a specific width b and a specific distance d from the structure respectively assigned to them, and the structures disposed on each mask having a distance $D \geqq 2d+b$ with respect to one another. The division of the structures can be effected in accordance with the method according to the invention described further above.

Furthermore, adjacent structures are held to be weakly coupled if $2d+b \leqq D \leqq 2(d+b)$, and not coupled if $D > 2(d+b)$. In this case, on the individual masks, in the case of adjacent weakly coupled structures, only an auxiliary structure is disposed between the structures.

In contrast to this, in the case of adjacent non-coupled structures, the latter may be assigned in each case dedicated auxiliary structures on the individual masks, i.e., by way of example, in each case two auxiliary structures are situated between structures that are not coupled.

The at least two masks of the mask set can advantageously be used to produce structures in the common exposure plane that are at a distance from one another: that is, less than $2d+b$. Although the structures disposed on the individual masks have a distance greater than or equal to $2d+b$, the at least two masks make it possible to produce structures in the radiation-sensitive layer with a distance less than that. The reason is that the structures contained on the individual masks emerged from a common layout containing structures with the small distance from one another, but these structures are divided between the at least two masks by using e.g. the method according to the invention described further above. These masks must be correspondingly aligned with one another during the imaging.

The at least two masks are preferably phase masks, in which case, on each of the individual masks, all structures have the same phase and all auxiliary structures have the opposite phase with respect thereto. The advantage in this case resides in a simple and global phase assignment. Phase conflicts between individual structures are insignificant on account of the decoupling.

The radiation used for imaging is preferably short-wave radiation, in particular UV radiation.

Other features that are considered as characteristic for the invention are set forth in the appended claims.

Although the invention is illustrated and described herein as embodied in a method for producing a mask set for lithography including at least one mask and methods for imaging structures of a predetermined layout into a common exposure plane, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The methods according to the invention are explained with reference to the imaging of contact holes. However, the invention is not restricted to contact holes, but rather can be applied to any structure to be imaged.

Figure 1:
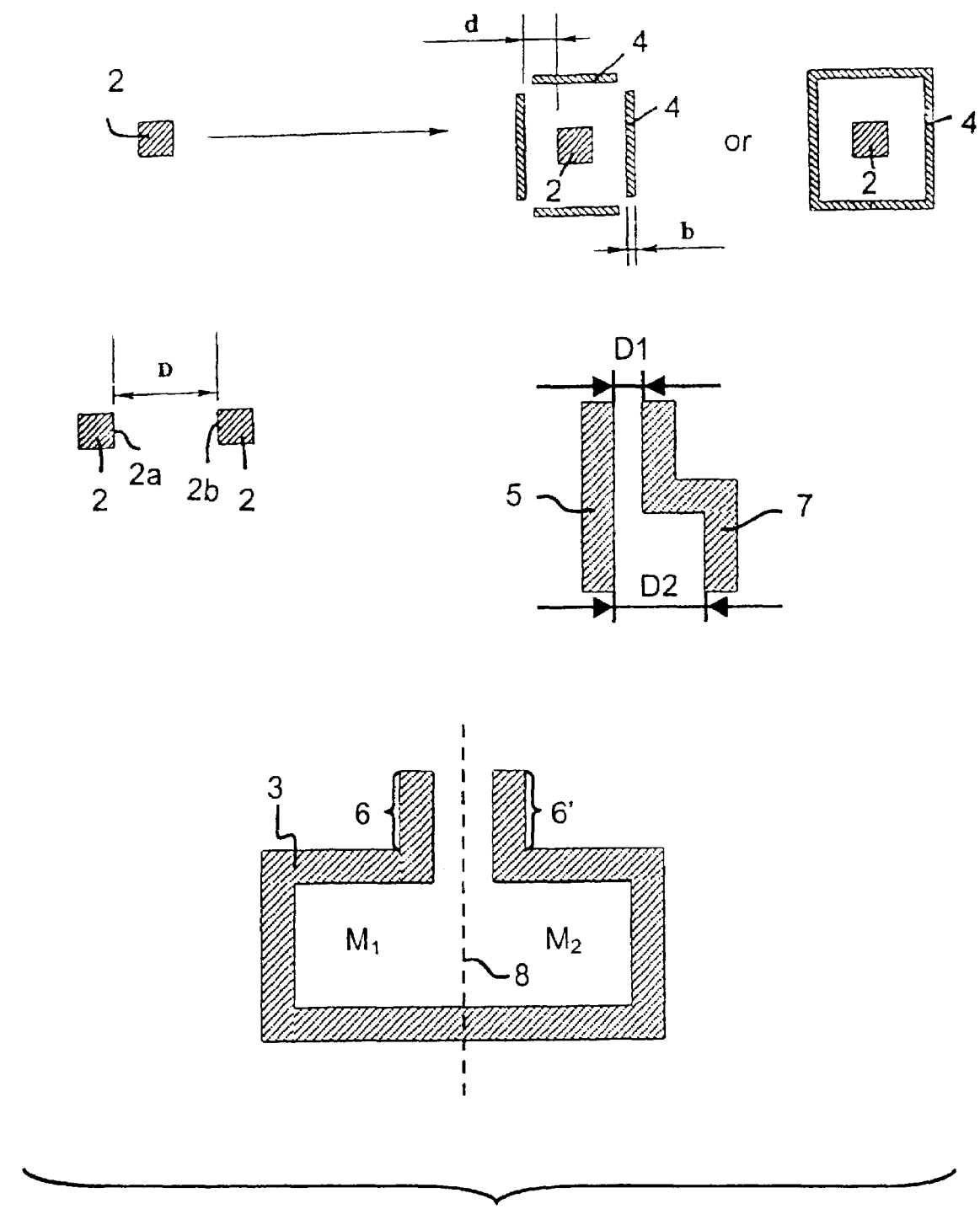
FIG. 1 is a diagrammatic sectional view showing contact holes with assigned auxiliary structures according to the invention.

Referring now to the figures of the drawings in detail and first, particularly to FIG. 1 thereof, there is shown contact holes 2, which represent the structures in this exemplary embodiment, and also a possible geometrical configuration of assigned auxiliary structures 4. The latter may be formed e.g. as separated straight sections or as contiguous peripheral structures. The different hatching of contact holes 2 and auxiliary structures 4 indicates the 180° phase shift between contact holes and assigned auxiliary structures. In this case, the auxiliary structures perform the function of diffusing elements that cannot be imaged.

FIG. 1 likewise illustrates a structure 3, which has two sections 6 and 6', which are strongly coupled on account of their small distance. In order to avoid the strong coupling, the structure 3 can be partitioned for example along the line 8 and be distributed between the masks $M_1$ and $M_2$.

FIG. 1 also depicts the width b of the auxiliary structures 4, the distance d thereof from the contact holes 2 assigned thereto, and the distance D between adjacent contact holes. The distance d and the width b are determined in a manner dependent on the size of the contact holes and the wavelength provided for the later imaging. This is carried out in a step that precedes the actual method. In this case, b and d are selected such that the auxiliary structures enable an as optimal as possible, but at least a sufficient improvement in the imageability of the structures. The width and the distance of the auxiliary structures depend inter alia on the wavelength used.

In the determination of b and d, by way of example, "free" structures may be taken as a basis and the auxiliary structures may be disposed in such a way as to achieve a good "process window" that is preferably as optimal as possible. A "free" structure is not coupled to adjacent structures. A good "process window" can be characterized in particular by the properties of good EDL (exposure dose latitude, exposure sensitivity), maximum defocus, and good "log slope". EDL describes the variation of the imaging with the exposure dose, while "log slope" is understood to be the tangent of the intensity curve during the desired imaging, that is to say the image contrast. It is possible to resort to simulations for determining the abovementioned properties, i.e. the search for those auxiliary structures that enable a correspondingly good "process window". Three-dimensional simulations are particularly favorable since it is possible therewith also to take account of three-dimensional effects, e.g. reduction of intensity through reflection and absorption of the initial radiation. As an alternative, it is also possible to resort to two-dimensional simulations taking account of the three-dimensional effects through suitable calibration. By way of example, the following set of parameters was used for the determination of the auxiliary structures for the contact holes:

Contact holes: phase 0 degree, transmission at 80%;

Auxiliary structures: phase 180 degrees, transmission at 50%.

On account of the scope of the simulations, a two-dimensional simulation is preferable for a complex layout.

The distance D is determined between the mutually opposite edges 2a and 2b of the adjacent structures. It can happen, particularly in the case of geometrically more complicated structures, that adjacent structures 5 and 7 have different distances $D_1$ and $D_2$ in sections. In the case of these structures, the smallest distance $D_1$, which essentially determines the coupling, is then generally used for further evaluation. The aim of eliminating strong couplings is to be taken into account in this case.

A wavelength of 248 nm was taken as a basis in the present case. The contact holes prescribed in the layout have a width of 140 nm and a length of 170 nm in this case. For the auxiliary structures, a width b of 90 nm and a distance d from the contact holes assigned to them of 160 nm were determined in this case.

Figure 2A:
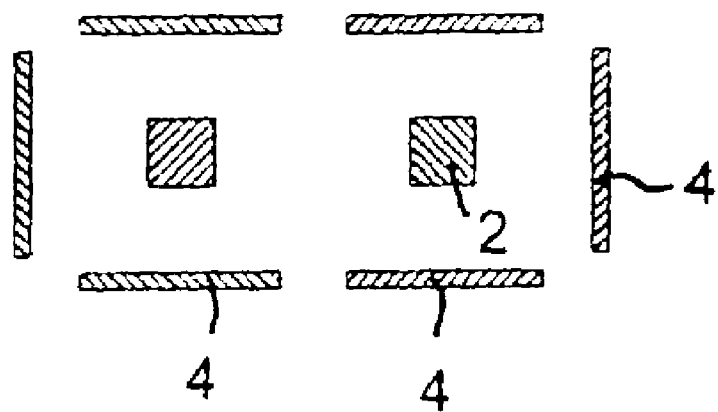
FIGS. 2A to 2C are plan views showing various configurations of auxiliary structures.
Figure 2B:
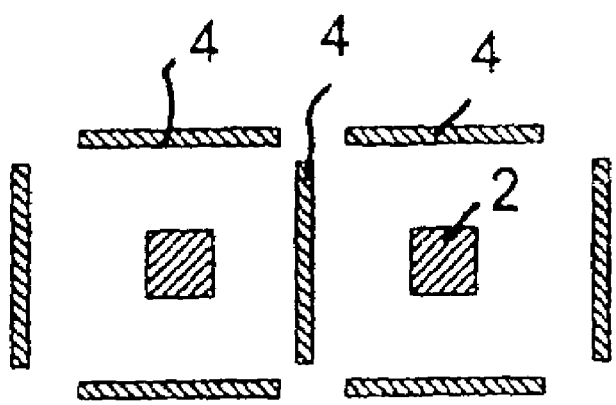
Figure 2C:
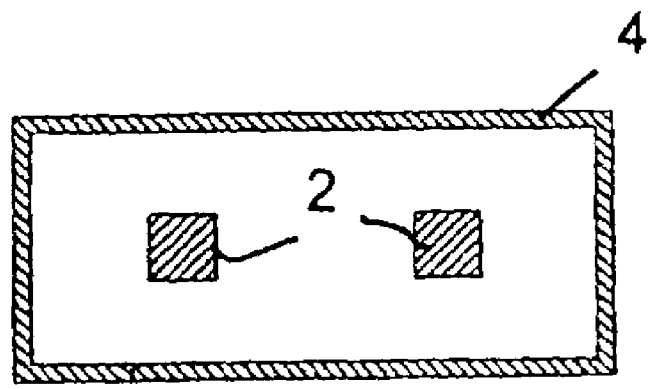

FIGS. 2A to 2C show different configurations of auxiliary structures 4. In this case, between adjacent contact holes 2, it is possible as required for auxiliary structures 4 to be either disposed (FIG. 2b) or omitted (FIGS. 2a and 2c). The auxiliary structures can also be formed as closed peripheral rings (FIG. 2C).

The starting point for the method according to the invention is a predetermined layout with a multiplicity of structures. These structures represent contact holes in the present case. Different layouts 10, 20, 30 are shown e.g. in the left-hand half of FIGS. 3A to 3B. Here the individual layouts 10, 20, 30 each have, by way of example, only two contact holes, but the latter are at a different distance from one another each time. The masks 16, 26, 36, 38 respectively produced are illustrated in the right-hand half of the figures.

Figure 3A:
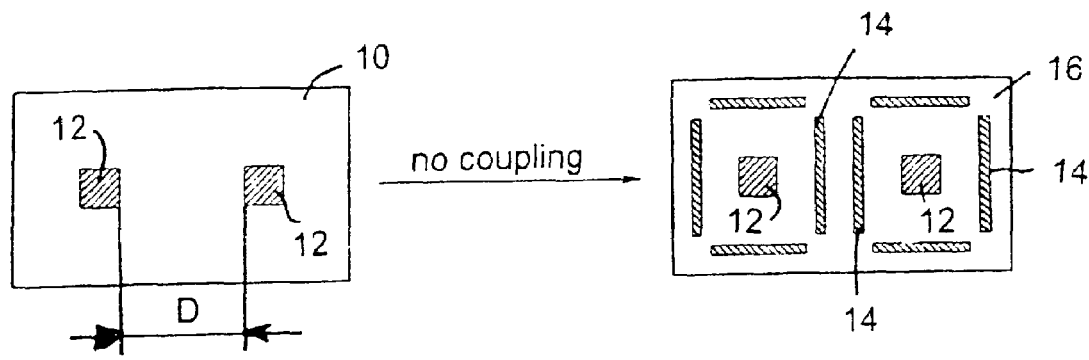
FIGS. 3A to 3C are plan views showing the division of contact holes in a manner dependent on the degree of coupling.

FIG. 3A shows adjacent contact holes 12, which are at a distance D from one another that is greater than 2(d+b). These contact holes are regarded as not coupled. Therefore, they need not, but may be distributed between different masks. Their mutual distance D is large enough in order that each contact hole 2 can be assigned dedicated auxiliary structures 14. In the present case, therefore, two auxiliary structures 14 are disposed on the mask 16 between the contact holes 12, the left-hand auxiliary structure of the two being assigned to the left-hand contact hole and the right-hand auxiliary structure of the two being assigned to the right-hand contact hole. The distance between contact hole and respective auxiliary structure corresponds to the previously selected d, i.e. 160 nm in the present case.

Figure 3B:
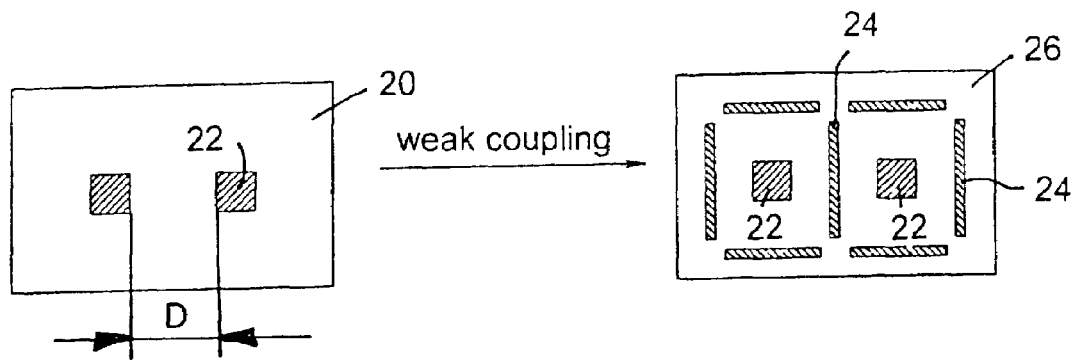

The distance D between the contact holes 22 illustrated in FIG. 3B in the layout 20 shown therein is $2d+b \leq D \leq 2(d+b)$. They are thus regarded as weakly coupled. Division between different masks is likewise not necessary here, but possibly desirable. The distance D suffices to dispose a single auxiliary structure 24 between the adjacent holes, i.e. the auxiliary structure 24 is assigned to the two contact holes 22.

Figure 3C:
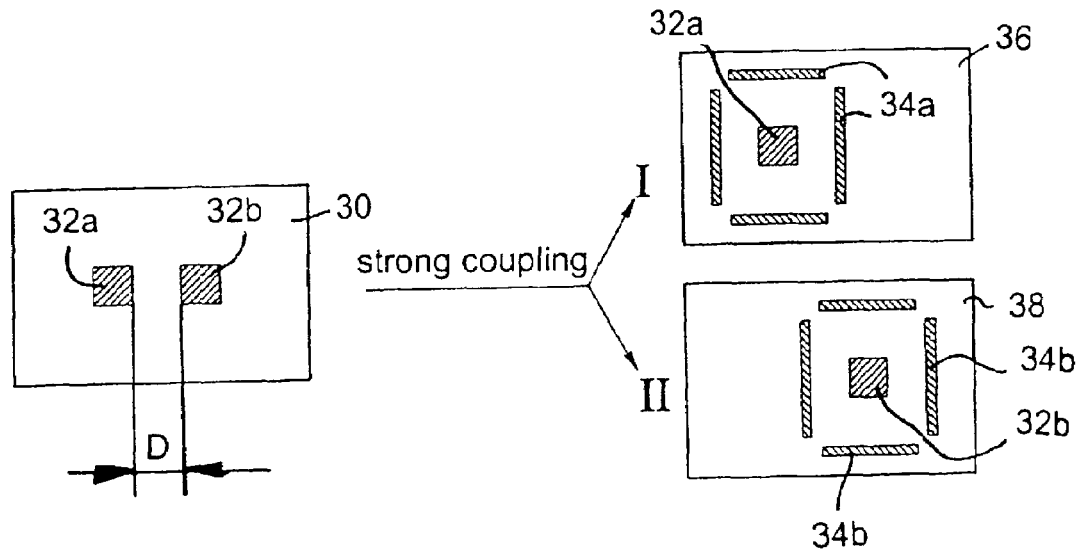

By contrast, FIG. 3C shows strongly coupled contact holes 32a and 32b, whose distance D is prescribed by the layout 30. The distance D is less than 2d+b. It is therefore necessary here to separate the contact holes. As can be discerned from the right-hand half of the figure, the contact holes were divided between two masks 36 and 38. The contact hole 32a was transferred to the mask 36, while the mask 38 contains the contact hole 32b. In the present case, the initially strongly coupled contact holes 32a and 32b have become contact holes that are not coupled since, for the sake of simplicity, no further contact holes are disposed on the individual masks. Each contact hole is then assigned dedicated auxiliary structures. The mask 36 produced accordingly has contact hole 32a and auxiliary structures 34a assigned thereto. By contrast, contact hole 32d with auxiliary structures 34b assigned thereto is disposed on the mask 38 produced.

FIG. 4 uses one-dimensionally strongly coupled contact holes to show the improved imaging of decoupled contact holes in comparison with previous methods in which no decoupling was effected. The simulation results were made on a simulator such as the one sold under the tradename OPTISSIMO® from the company aiss, Munich, are illustrated in FIG. 4. The above values were taken as a basis, i.e. wavelength=248 nm, width b=90 nm, distance d=160 nm, width of the contact holes=140 nm, length of the contact holes=170 nm.

Figure 4A:
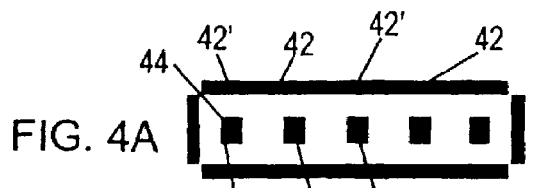
FIGS. 4A to 4F are plan views showing the imaging quality.

FIG. 4A shows closely adjacent contact holes 40, 40' and assigned auxiliary structures 42, 42', contact holes and assigned auxiliary structures having a phase difference (blue to green) of 180°. All the contact holes and auxiliary structures are disposed on a mask in accordance with the method mentioned in the cited specialist article by M. Sugawara et al., "Evaluation of Phase-Shifting Masks for Dense Contact Holes Using the Exposure-Defocus and Mask Fabrication Latitude Methodology" Jpn. J. Appl. Phys, Vol. 33 (1994), pp. 6801–6808. The simulations 44 show a slight imaging (black) only in the case of the respective outer contact holes. The contact holes are predominantly not imaged.

Figure 4B:
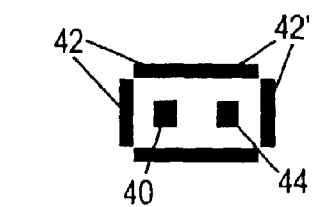
Figure 4B:
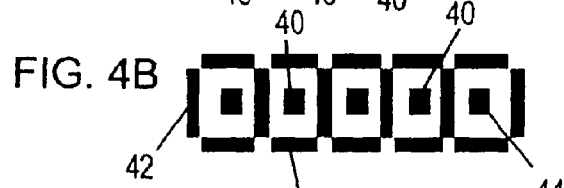

In FIG. 4B, auxiliary structures 42 were additionally disposed between the individual contact holes 40, here all the contact holes having been assigned the same phase (green) and all the auxiliary structures 42 having been assigned a phase (blue) shifted through 180° with respect thereto. The imageability of these contact holes disposed on a mask is likewise unsatisfactory (black).

Figure 4C:
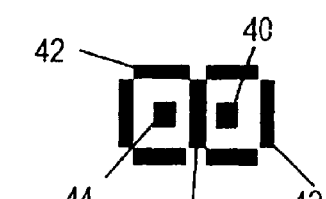
Figure 4C:
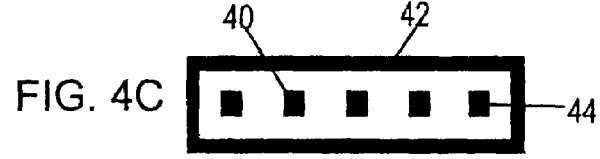

Even when the auxiliary structures 42 are combined to form a peripheral auxiliary structure (blue) with a phase shifted through 180° with respect to the contact holes 40 (green) in accordance with FIG. 4C, the simulation 44 (black) of the imaging does not produce good results.

Figure 4D:
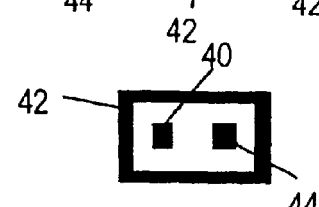
Figure 4D:
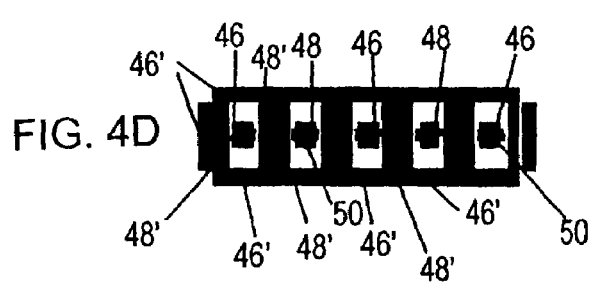
Figure 4E:
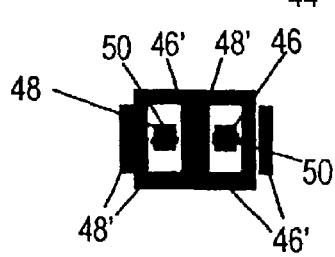
Figure 4E:

By contrast, FIGS. 4D and 4E show masks produced by the method according to the invention and the imaging of the masks. The contact holes 46 (green) and the auxiliary structures 46' (blue) are disposed on one mask and the contact holes 48 (orange) and the auxiliary structures 48' (magenta) are disposed on a second mask. The contact holes and the respectively assigned auxiliary structures have a phase shifted through 180°. The two masks are placed one above the other in this illustration. However, the individual masks are imaged separately. The simulation 50 (black) of the imaging of the contact holes yields very good results. It is clearly discernible that all the contact holes 46 of one mask have the same phase and the auxiliary structures 46' disposed on the mask have the opposite phase with respect thereto. In the case of the other mask, this likewise applies to the structures 48 and auxiliary structures 48'.

Figure 4F:
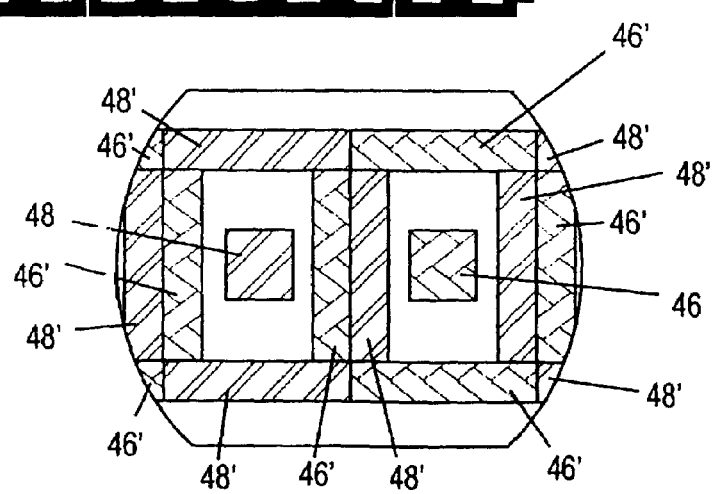

FIG. 4F illustrates an enlarged detail from FIG. 4E in order to provide a better understanding, the results of the simulation having been omitted for the sake of clarity. Mutually assigned contact holes and auxiliary structures are illustrated with identical hatching here.

Figure 5:
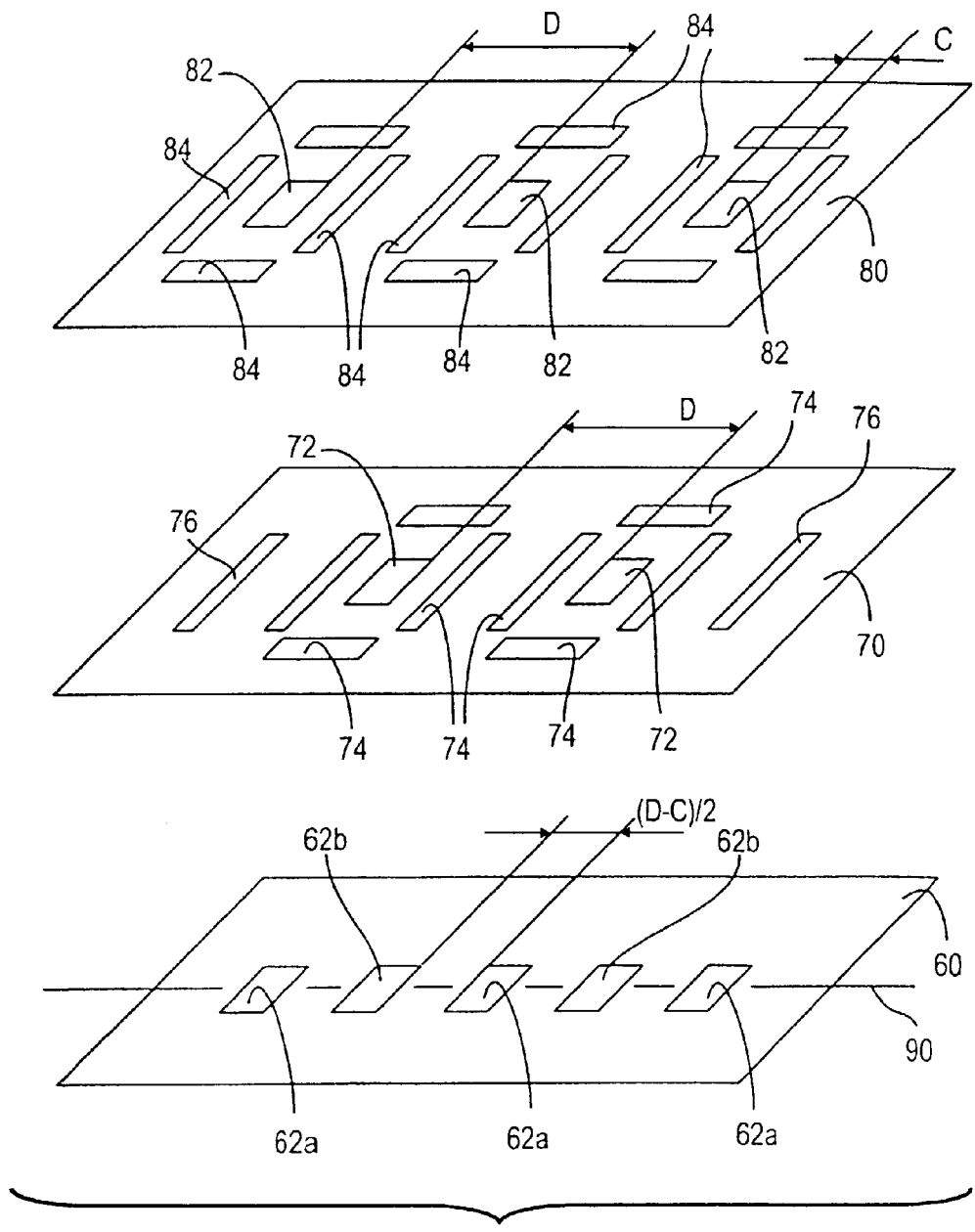
FIG. 5 is a perspective view showing the imaging of contact holes with two masks.

The imaging of the patterns—transferred to two masks—of contact holes onto a substrate 60 is illustrated in a perspective illustration in FIG. 5. The substrate may be a photoresist layer applied to e.g. an insulation layer to be patterned. If working with a wavelength of 248 nm, a photoresist layer sensitive to this wavelength should be used.

Transparent regions 72 and 82 are disposed on the masks 70 and 80, which transparent regions, in the present case, represent patterns of contact holes that are intended to be imaged. These patterns correspond to the structures divided in accordance with the method described further above. 74 and 84 designate auxiliary structures assigned to the respective regions 72 and 82. The auxiliary structures are too narrow to be imaged with the wavelength used, but they are still wide enough to diffract part of the radiation striking them. The radiation diffracted at the edges of the auxiliary structures and the radiation diffracted at the opposite edges of the regions respectively assigned thereto interfere with one another and, in the process, lead to a sharper imaging of the edges of the regions 72 and 82. More sharply imaged contact holes 62a, 62b are thereby produced on the substrate 60 that lies in the common exposure plane of the masks 70 and 80.

The masks 70 and 80 are successively individually exposed and imaged. Of course, the respective other mask is then not situated in the beam path of the imaging optical configuration. The illustration chosen is intended merely to convey an impression of the relative orientation of the two masks with respect to one another and the position of the contact holes imaged by using the two masks.

Furthermore, mask 70 has additional auxiliary structures 76. The latter are intended to result in a symmetrical configuration of the auxiliary structures with regard to all the regions 82 and 84. The two regions 72 are surrounded symmetrically both by auxiliary structures 74 on the mask 70 and by auxiliary structures 84 of the mask 80. This applies equally to the central region 82 of the mask 80. In order also to produce the symmetry for the respective outer regions 82 of the mask 80, the auxiliary structures 76 are additionally disposed in the mask 70. The configuration thereof corresponds to a symmetrical continuation of the auxiliary structure configuration along the coupling axis 90, which runs along the centrally disposed connecting line between the individual regions. The course of the coupling axis 90 is indicated in the plane 60 of the imaged contact holes.

The additional auxiliary structures 76 result in identical conditions during the imaging of all the regions 72 and 82. Thus, e.g. during exposure of the mask 80, an increase in intensity can also be observed between the imaged regions 82, even though intrinsically no structures are intended to be imaged at this location with the mask 80. This increase in intensity originates from diffraction and interference effects on account of the auxiliary structures lying between the regions 82. The position of this increase in intensity corresponds to the position of the regions 72 or contact holes to be imaged with the mask 70. Therefore, the imaging of the mask 80 already leads to a latent image in the photolayer serving as substrate 60. It should be remembered here that the intensity of the latent image and thus the structure obtained after the development of the photolayer depends on the exposure, which is the product of intensity of the radiation attained for the imaging and time.

During the imaging of the mask 70, by contrast, such additional increases in intensity would not be formed at the locations to the sides of the regions 72 if the additional auxiliary structures 76 were not disposed on the mask 70. Therefore, these auxiliary structures lead to identical conditions for all the contact holes to be imaged.

Structures having a smaller distance than prescribed by the individual masks can be produced using the two masks 70 and 80. On the two masks, the regions 72 and 82 are respectively at a distance D from one another. However, contact holes which are at a distance from one another of less than or equal to D/2 are produced as a result of the successive imaging of the two masks. Since the minimum distance between the regions 72 and 82, respectively, on the individual masks is 2d+b, contact holes having a minimum distance of less than D/2=d+b/2, in particular having a distance of d+b/2−C/2, can accordingly be produced with two masks. This increases the integration density considerably. C is the width of a contact hole in this case.

The contact holes 62a were produced with the mask 80, whereas the contact holes 62b were produced with the mask 70. The position of the regions 72 and 82 representing the respective contact holes 62a and 62b are offset with respect to one another in the present case. The masks 70 and 80 must accordingly be aligned with one another.

The division of the regions 72 and 82 between the two masks 70 and 80 enables the configuration of the respectively assigned auxiliary structures and thus an improved imaging.

We claim:

1. A method for producing a mask set for lithography including a mask, which comprises:

using, as a basis, a predetermined layout of structures to be imaged into a common exposure plane and transferred to the mask; and transferring the structures depending on a coupling of the structures such that the structures are not strongly coupled on the mask; and assigning auxiliary structures to individual ones of the structures for improving imageability of the structures, the assigned auxiliary structures not being imageable with radiation provided for imaging the masks, and having a specific distance d from the structure respectively assigned to the auxiliary structures and a specific width b;

determining distances D between adjacent structures;

classifying the distances D in a manner depending on coupling strength of the adjacent structures:
strong coupling being present if D<2d+b, and
at least one of weak or no coupling being present if $D \geq 2d \times b$; and dividing the structures between the masks to configure only weakly coupled structures and uncoupled structures on any one of the masks.

2. The method according to claim 1, which further comprises:
including a further mask in the mask set for imaging into the common exposure plane; and
distributing any strongly coupled structures, being so closely adjacent one another, at least in sections, to be strongly coupled if simultaneously imaged, between the mask and the further mask of the mask set.

3. The method according to claim 1, which further comprises:
in the classifying step, identifying structures exhibiting weak and no coupling,
weak coupling being present if $2d+b \leq D \leq 2(d+b)$, and no coupling being present if $D>2(d+b)$; and applying, when two adjacent structures are weakly coupled on one of the individual masks, an auxiliary structure between the weakly coupled structures.

4. The method according to claim 3, which further comprises assigning a dedicated auxiliary structure to each structure of the adjacent non-coupled structures on the respective mask.

5. The method according to claim 1, which further comprises, for each strongly coupled structure, generating additional auxiliary structures and disposing the additional auxiliary structures on individual masks to provide, after the strongly coupled structures have been divided between the individual masks of the mask set, a symmetrical configuration of the auxiliary structures to be present with regard to the strongly coupled structures on the masks.

6. The method according to claim 1, which further comprises forming the structures and the auxiliary structures on the masks by phase-shifting regions of the structures transparent to a radiation for imaging the masks by 180° relative to the auxiliary structures respectively assigned thereto.

7. The method according to claim 1, which further comprises forming the structures from patterns of closely adjacent contact holes.

8. A method for imaging structures of a predetermined layout into a common exposure plane, which comprises:
providing a mask set including a phase mask, the mask being imageable by a given radiation;
applying structures onto the mask, the structures all having a given phase and being one of coupled and not coupled to one another;
applying auxiliary structures assigned to the structures onto the mask, the auxiliary structures not being imageable by the given radiation, improving an imageability of the structures assigned thereto and having a phase opposite the given phase of the structures;
the auxiliary structures having a specific width b and a specific distance d from the structure respectively assigned thereto; and
the structures disposed on each mask having a distance $D \geq 2d+b$ with respect to one another.

9. The method according to claim 8, which further comprises:
labeling adjacent structures as weakly coupled if $2d+b \leq D \leq 2(d+b)$ and labeling adjacent structures as not coupled if $D>2(d+b)$; and applying only one of the auxiliary structures between the adjacent weakly coupled structures on a given one of the masks.

10. The method according to claim 8, which further comprises assigning dedicated auxiliary structures to adjacent non-coupled structures on a given one of the masks.

11. The method according to claim 8, which further comprises forming the structures from patterns of closely adjacent contact holes.

12. The method according to claim 8, which further comprises:
providing a further mask in the mask set; and
imaging the mask and the further mask successively into the common exposure plane.

13. The method according to claim 8, which further comprises using a layer sensitive to the given radiation as the common exposure plane.

14. The method according to claim 8, which further comprises:
providing a further mask in the mask set; and
applying the structures with a distance with respect to one another less than 2d+b by using the mask and the further mask of the mask set in the common exposure plane.

15. The method according to claim 14, wherein the distance between the structures is less than d+b/2.

16. A method for imaging structures of a predetermined layout into a common exposure plane, which comprises:
providing a mask set including at least two masks;
applying structures onto the masks, the structures on any given one of the masks being one of weakly coupled and not coupled to one another;
applying auxiliary structures on the masks and assigning the auxiliary structures to one of the structures, the auxiliary structures not being imageable by a radiation used for imaging the masks and improving an imageability of the structures assigned thereto, the auxiliary structures further having a specific width b and a specific distance d from the structure respectively assigned thereto, and
spacing the structures on each of the masks at a distance $D \geq 2d+b$ with respect to one another.

17. The method according to claim 16, which further comprises:
labeling adjacent structures as weakly coupled if $2d+b \leq D \leq 2(d+b)$;

labeling adjacent structures as not coupled if D>2(d+b); and applying one of the auxiliary structures between the adjacent weakly coupled structures disposed on each of the masks.

18. The method according to claim 16, which further comprises assigning dedicated auxiliary structures to adjacent non-coupled structures on a given one of the masks.

19. The method according to claim 16, which further comprises forming the structures from patterns of closely adjacent contact holes.

20. The method according to claim 16, which further comprises imaging the two masks successively into the common exposure plane.

21. The method according to claim 16, which further comprises using a layer sensitive to the given radiation as the common exposure plane.

22. The method according to claim 16, which further comprises producing structures having a distance with respect to one another less than 2d+b using the two masks of the mask set in the common exposure plane.

23. The method according to claim 22, wherein the distance between the structures is less than d+b/2.

24. The method according to claim 16, wherein:
the masks are phase masks; and
on each of the individual masks, all of the structures have a given phase and all of the auxiliary structures have a phase opposite the given phase.

\* \* \* \* \*

UNITED STATES PATENT AND TRADEMARK OFFICE
CERTIFICATE OF CORRECTION

PATENT NO.       : 7,183,022 B2                                           Page 1 of 1
APPLICATION NO.  : 10/439193
DATED            : February 27, 2007
INVENTOR(S)      : Molela Moukara et al.

It is certified that error appears in the above-identified patent and that said Letters Patent is hereby corrected as shown below:

Column 13,
Line 13, "$D \geq 2dxb$" should read -- $D \geq 2d+b$ --

Signed and Sealed this

Eleventh Day of September, 2007

JON W. DUDAS
*Director of the United States Patent and Trademark Office*